US012776755B2

(12) United States Patent
Matsushita et al.

(10) Patent No.: US 12,776,755 B2
(45) Date of Patent: Oct. 27, 2026

(54) ELECTRONIC COMPONENT

(71) Applicant: Murata Manufacturing Co., Ltd., Kyoto-fu (JP)

(72) Inventors: Yosuke Matsushita, Nagaokakyo (JP); Akira Tanaka, Nagaokakyo (JP); Yuji Kaminishi, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 113 days.

(21) Appl. No.: 18/650,228

(22) Filed: Apr. 30, 2024

(65) Prior Publication Data

US 2024/0283423 A1 Aug. 22, 2024

Related U.S. Application Data

(63) Continuation of application No. PCT/JP2022/036923, filed on Oct. 3, 2022.

(30) Foreign Application Priority Data

Nov. 11, 2021 (JP) ................................ 2021-184315

(51) Int. Cl.

| | |
|---|---|
| ***H03H 7/01*** | (2006.01) |
| ***H01G 4/005*** | (2006.01) |
| ***H01G 4/30*** | (2006.01) |
| ***H01G 4/40*** | (2006.01) |
| ***H03H 1/00*** | (2006.01) |

(52) U.S. Cl.
CPC ........... *H03H 7/0115* (2013.01); *H01G 4/005* (2013.01); *H01G 4/30* (2013.01); *H01G 4/40* (2013.01); *H03H 2001/0085* (2013.01)

(58) Field of Classification Search
CPC ..................... H03H 7/0115; H03H 2001/0085
USPC ................................................. 333/175, 185
See application file for complete search history.

(56) References Cited

FOREIGN PATENT DOCUMENTS

| | | | | |
|---|---|---|---|---|
| JP | H06-060131 A | 8/1994 | | |
| JP | H06-060131 U | 8/1994 | | |
| JP | 2005-203629 A | 7/2005 | | |
| JP | 2015-026730 A | 2/2015 | | |
| JP | 2016-039334 A | 3/2016 | | |
| JP | 2016-149425 A | 8/2016 | | |
| JP | 2018-190915 A | 11/2018 | | |
| WO | WO-2013005483 A1 * | 1/2013 | ........... | H01F 27/292 |
| WO | 2017/199734 A1 | 11/2017 | | |

OTHER PUBLICATIONS

International Search Report for PCT/JP2022/036923 dated Dec. 20, 2022.

* cited by examiner

*Primary Examiner* — Rakesh B Patel
(74) *Attorney, Agent, or Firm* — McDonald Hopkins LLC

(57) ABSTRACT

An electronic component includes: a body having a first surface; and a plurality of electrodes disposed on the first surface. Each of the plurality of electrodes includes a base electrode and a plating film covering the base electrode. The plurality of electrodes include: first-class electrodes individually disposed on the first surface and connected to each other by a wiring line passing through an inside of the body; and a second-class electrode individually disposed on the first surface and not connected to other electrodes of the plurality of electrodes. On the first surface, a second region in which the second-class electrode is disposed more protrudes than a first region in which each of the first-class electrodes is disposed.

16 Claims, 13 Drawing Sheets

ELECTRONIC COMPONENT

CROSS REFERENCE TO RELATED APPLICATION

This is a continuation of International Application No. PCT/JP2022/036923 filed on Oct. 3, 2022 which claims priority from Japanese Patent Application No. 2021-184315 filed on Nov. 11, 2021. The contents of these applications are incorporated herein by reference in their entireties.

BACKGROUND OF THE DISCLOSURE

Field of the Disclosure

The present disclosure relates to an electronic component.

Description of the Related Art

International Publication No. 2017/199734A1 (PTL 1) discloses a stack-type electronic component. In PTL 1, a low-pass filter as an example of a stack-type filter is formed by stacking a plurality of dielectric layers. The electronic component has a lower surface on which input and output terminals and a ground electrode are formed as a plurality of electrodes. A plating film may be applied to the surfaces of these electrodes.

PTL 1: International Publication No. 2017/199734A1

BRIEF SUMMARY OF THE DISCLOSURE

In the case where a plurality of electrodes are disposed on one surface of the electronic component, the plurality of electrodes are collectively subjected to a plating treatment. However, among the plurality of electrodes disposed on the same surface, there may be a difference in thickness of a plating film adhering thereto. Such a difference in thickness of the plating film may lead to uneven heights of the surfaces of the entire electrodes including the plating film. Thus, when the electronic component is mounted, an electrical connection may not be sufficiently ensured in an electrode with an insufficient height, which may cause a failure.

Thus, a possible benefit of the present disclosure is to provide an electronic component in which unevenness in height of a surface of each electrode having been subjected to a plating treatment is reduced.

In order to achieve the above-described possible benefit, an electronic component based on the present disclosure includes: a body having a first surface; and a plurality of electrodes disposed on the first surface. Each of the plurality of electrodes includes a base electrode and a plating film covering the base electrode. The plurality of electrodes include: first-class electrodes individually disposed on the first surface and connected to each other by a wiring line passing through an inside of the body; and a second-class electrode individually disposed on the first surface and not connected to other electrodes of the plurality of electrodes. On the first surface, a second region in which the second-class electrode is disposed more protrudes than a first region in which each of the first-class electrodes is disposed.

According to the present disclosure, the second region in which the second-class electrode is disposed more protrudes than the first region in which each of the first-class electrodes is disposed, and thus, unevenness in height of the surface of each electrode having been subjected to a plating treatment can be reduced due to a difference in growth rate of the plating film.

DETAILED DESCRIPTION OF THE DISCLOSURE

The dimension ratio shown in the accompanying drawings does not always faithfully show the actual dimension ratio, but the dimension ratio may be exaggerated for the sake of explanation. In the following description, mentioning the concept "upper" or "lower" does not necessarily indicate an absolute upper or lower position, but may indicate a relatively upper or lower position in the posture shown in each figure.

In general, in order to obtain a plurality of electrodes disposed on a surface of an electronic component, adopted is a method of first preparing a structure having a surface on which a plurality of base electrodes are disposed, and then subjecting the prepared structure to a plating treatment to grow a plating film on the surface of each of the base electrodes. By paying attention to the plurality of base electrodes disposed on the same surface, however, the present inventors have noticed that there was a difference in growth rate of the plating film among the individual base electrodes.

As a result of studies, the present inventors found that, even among a plurality of base electrodes disposed on the same surface, a plating film grows differently, and specifically, tends to grow relatively fast on a base electrode electrically connected to other base electrodes and tends to grow relatively slow on a base electrode not electrically connected to any one of other base electrodes. Based on this finding, the present inventors made the following disclosure.

First Embodiment

Figure 1:
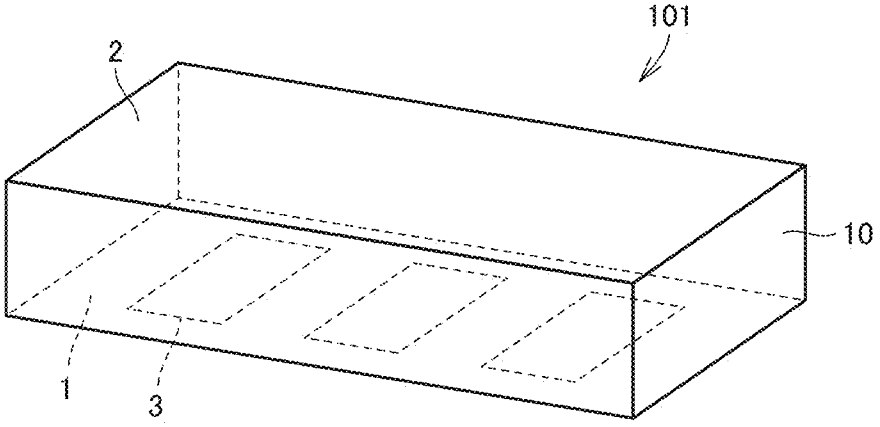
FIG. 1 is a first perspective view of an electronic component in a first embodiment based on the present disclosure.
Figure 2:
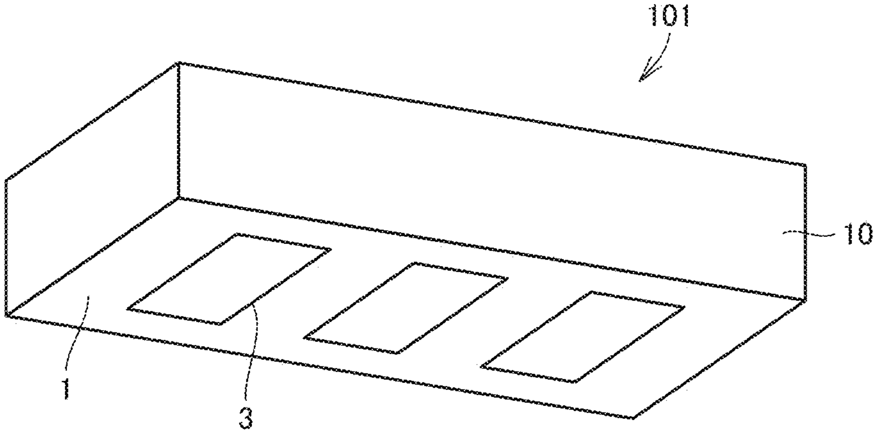
FIG. 2 is a second perspective view of the electronic component in the first embodiment based on the present disclosure.
Figure 3:
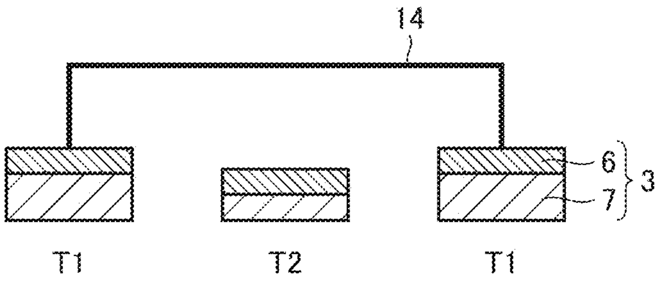
FIG. 3 is a schematic diagram showing a positional relation among a plurality of electrodes included in the electronic component in the first embodiment based on the present disclosure, when viewed from a lateral side.

Referring to FIGS. 1 to 3, an electronic component in the first embodiment based on the present disclosure will be hereinafter described. FIG. 1 shows a perspective view of an electronic component 101 in the present embodiment. FIG. 2 shows electronic component 101 viewed obliquely from below. Electronic component 101 has a first surface 1 and a second surface 2. In FIG. 1, first surface 1 is a lower surface and second surface 2 is an upper surface. A plurality of electrodes 3 are disposed on first surface 1. In this case, three electrodes 3 are disposed by way of example. Each electrode 3 includes a base electrode 6 and a plating film 7. Base electrode 6 is made of metal. The material of base electrode 6 may be Cu, for example. Plating film 7 is grown by performing a plating treatment on base electrode 6.

FIG. 3 schematically shows the positional relation among the plurality of electrodes 3 when viewed from a lateral side. The height at which base electrode 6 is held is different among electrodes 3. Base electrodes 6 have the same thickness. The thickness of plating film 7 is different among individual electrodes 3. The height of the lower surface of each electrode 3 is substantially the same. In FIG. 3, a wiring line 14 connecting electrodes 3 is schematically shown by a thick line. In practice, wiring line 14 may be implemented by a combination of a conductor pattern, a conductor via, and the like incorporated in a body 10. Not only FIG. 3 but also some of the following figures schematically show wiring line 14 irrespectively of its actual shape.

Electronic component 101 in the present embodiment includes: body 10 having first surface 1; and a plurality of electrodes 3 disposed on first surface 1. Each of the plurality of electrodes 3 includes base electrode 6 and plating film 7 covering base electrode 6. The plurality of electrodes 3 include: first-class electrodes T1 individually disposed on first surface 1 and connected to each other by wiring line 14 passing through the inside of body 10; and a second-class electrode T2 individually disposed on first surface 1 and not connected to other electrodes 3. On first surface 1, a second region in which second-class electrode T2 is disposed more protrudes than a first region in which each first-class electrode T1 is disposed.

In this case, the "first region" and the "second region" each are considered as a part of first surface 1. In other words, the "first region" and the "second region" refer not to each electrode itself but to a portion of a base surface that supports each electrode.

As is apparent from the above-mentioned finding, when comparing first-class electrode T1 and second-class electrode T2 in the present embodiment, in the case of electrolytic plating, a plating film grows relatively fast when first-class electrode T1 is formed, whereas a plating film grows relatively slow when second-class electrode T2 is formed. In the present embodiment, on first surface 1, the second region in which second-class electrode T2 is disposed more protrudes than the first region in which each first-class electrode T1 is disposed. Thus, the height of the base surface at which base electrode 6 is held is different, but the growth rate of plating film 7 is different depending on whether first-class electrode T1 or second-class electrode T2 is disposed, and therefore, the obtained plating films 7 are different in thickness as shown in FIG. 3. Also, by appropriately setting the difference in height between the first region and the second region on first surface 1 in advance, the height of the lower surface of each plating film 7 having been subjected to a plating treatment can be made substantially the same. In other words, unevenness in height of the surface of each electrode 3 having been subjected to a plating treatment can be reduced.

The height of the surface of each electrode 3 can be made substantially the same, which makes it possible to avoid a contact failure occurring at the stage of checking the characteristics of the electronic component for screening selection. Further, an OPEN failure occurring when the electronic component is mounted on some type of substrate or the like can be avoided. The "OPEN failure" used herein is one type of connection failure and means the state in which an electrical connection is not established between components that should essentially be electrically connected to each other.

Figure 4:
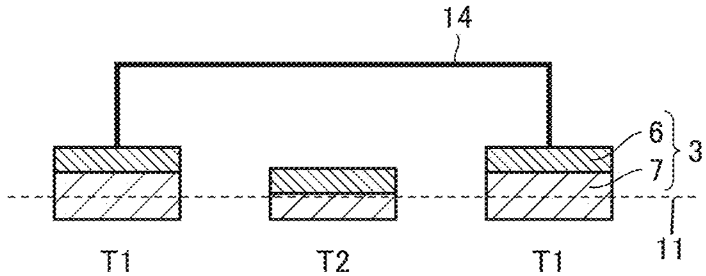
FIG. 4 is a schematic diagram showing a positional relation with respect to a reference plane among the plurality of electrodes included in the electronic component in the first embodiment based on the present disclosure, when viewed from the lateral side.

As shown in FIG. 4, when first surface 1 has a reference plane 11, in the present embodiment, for example, second-class electrode T2 may be disposed such that the lower surface of base electrode 6 coincides with reference plane 11, and each first-class electrode T1 may be disposed such that the lower surface of base electrode 6 is located to be more recessed than reference plane 11, i.e., located above reference plane 11 in the figure.

Figure 5:
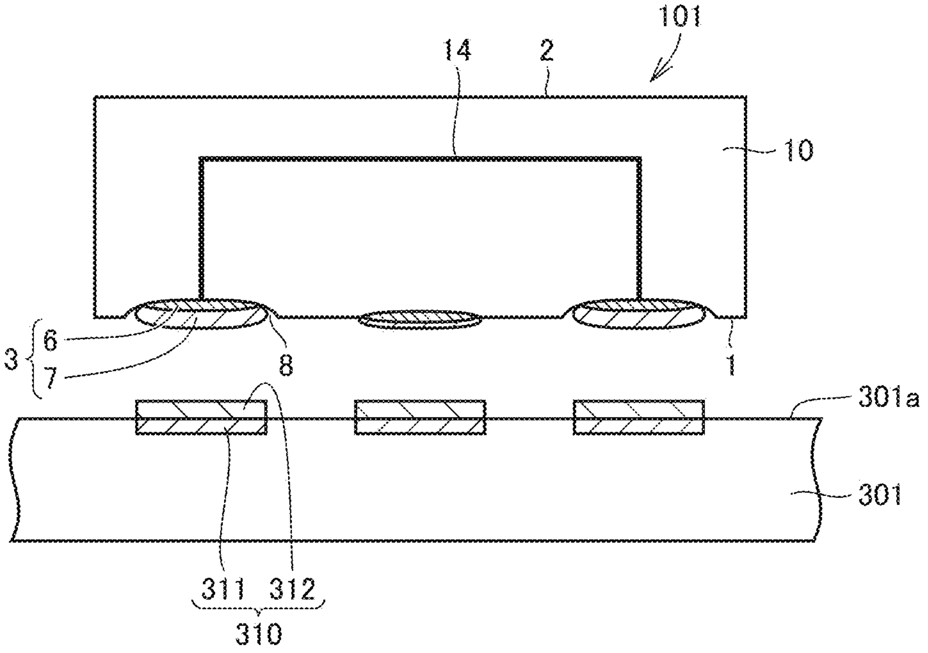
FIG. 5 is an explanatory diagram showing a manner in which the electronic component in the first embodiment based on the present disclosure is to be mounted on a substrate.
Figure 6:
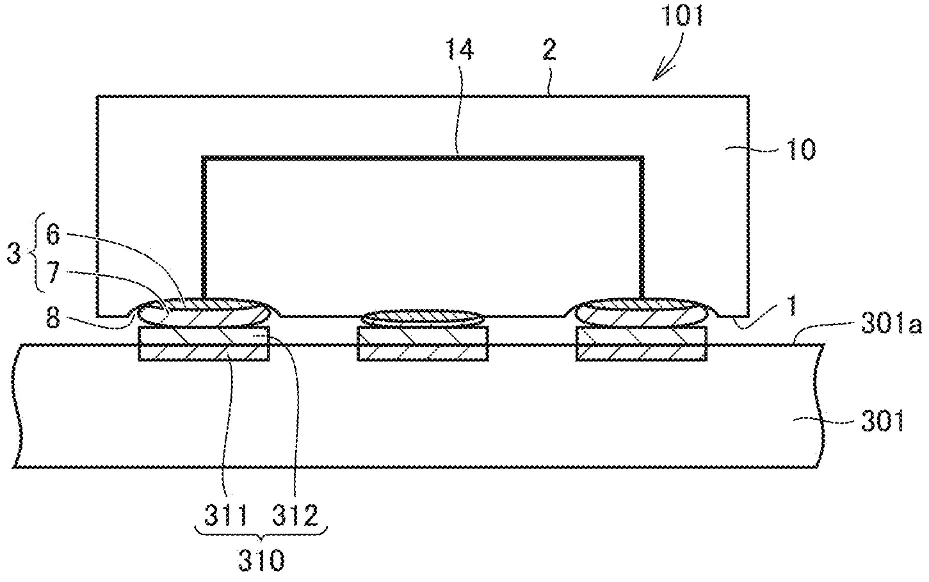
FIG. 6 is an explanatory diagram showing a state in which the electronic component in the first embodiment based on the present disclosure is mounted on the substrate.

FIG. 5 shows the manner in which electronic component 101 in the present embodiment is to be mounted on a substrate 301. First surface 1 has a recess 8 locally provided to correspond to the first region that is disposed inside recess 8. Substrate 301 has a surface 301*a*. An electrode 310 is disposed on surface 301*a*. Electrode 310 includes a base electrode 311 and a plating film 312 formed to cover base electrode 311. Electrodes 3 and 310 are soldered to each other, which results in the state shown in FIG. 6. Note that solder is not shown in the figure. Since the height of the lower surface of each electrode 3 is substantially the same, electrodes 3 and 310 are appropriately connected to each other for each of the plurality of electrodes 3, so that electronic component 101 can be properly mounted.

In the example shown in FIG. 5, for example, recess 8 is provided at a position close to each of the left and right ends of first surface 1. When recess 8 is provided at a position close to the end of first surface 1, a remaining portion not corresponding to recess 8 in the region between recess 8 and the end of first surface 1 protuberates with a narrow width. In a portion where the remaining portion protuberates only with a narrow width to a certain degree or more, a crack tends to occur when barrel polishing is performed on body 10. For example, when the cross-sectional view shows a positional relation in which the cross-sectional curve of the inner surface of recess 8 overlaps with the cross-sectional curve of an R-shape formed by barrel polishing performed on body 10, a pointed shape is formed at a point as a vertex at which the cross-sectional curve of the inner surface of recess 8 and the cross-sectional curve of the R-shape formed by the barrel polishing intersect with each other, with the result that a crack is particularly more likely to occur.

Figure 7:
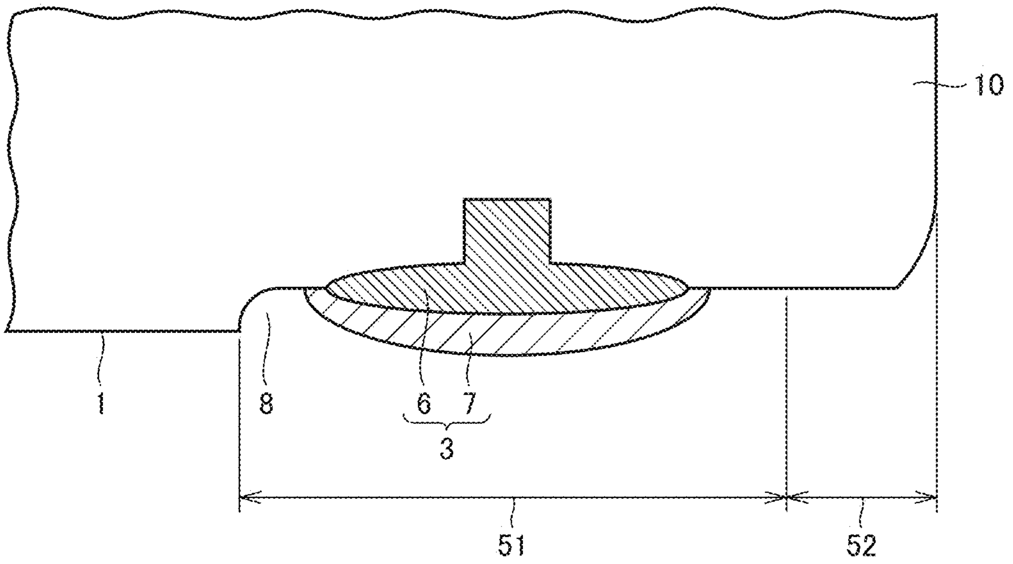
FIG. 7 is a partial enlarged cross-sectional view of a first modification of the electronic component in the first embodiment based on the present disclosure.

Thus, in order to avoid such occurrence of a crack, when recess 8 is located close to the end of first surface 1, a structure having recess 8 extending to the end of first surface 1 may be adopted as shown in FIG. 7. In other words, the recess may be formed to extend to the end of first surface 1. In FIG. 7, recess 8 is formed to extend to the end of first surface 1, and consequently, a protuberance as a remaining portion does not appear between recess 8 and the end of first surface 1. Such a configuration makes it possible to avoid occurrence of a local protuberance with a narrow width, with the result that the probability of occurrence of a crack can be reduced. FIG. 7 shows regions 51 and 52. Region 51 is a region in which recess 8 would have existed if recess 8 is not extended. Region 52 is a region in which an R-shape would have been formed by barrel polishing if recess 8 is not extended. In the example shown herein, regions 51 and 52 are in contact with each other without being spaced apart from each other. As shown in FIG. 7, recess 8 is formed to extend to the end of first surface 1, and consequently, recess 8 continuously extends to the inside of region 52.

Figure 8:
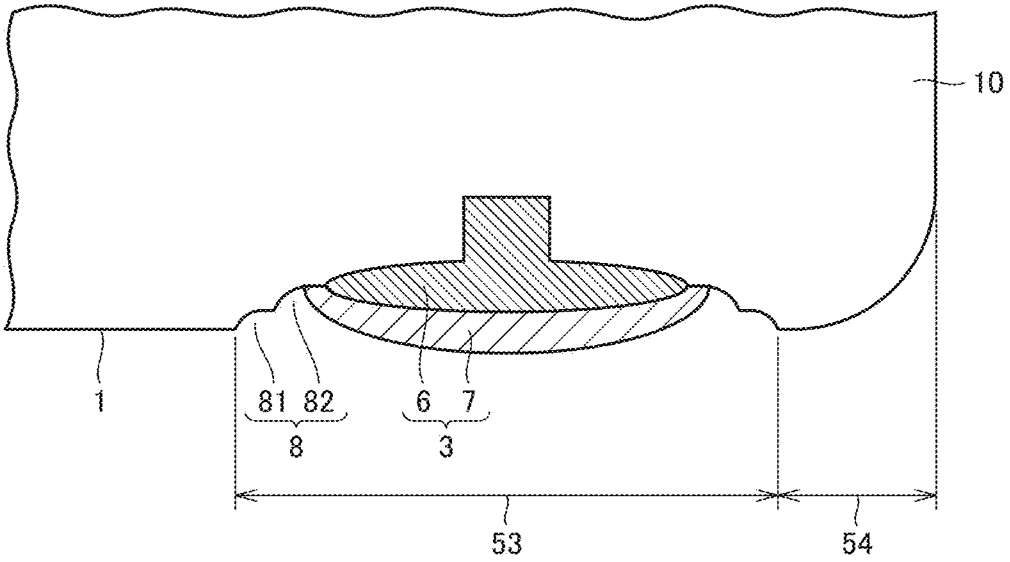
FIG. 8 is a partial enlarged cross-sectional view of a second modification of the electronic component in the first embodiment based on the present disclosure.

When the depth of recess 8 is large to some extent, recess 8 has an end that is sharply dug down. Thereby, a pointed shape is formed at the boundary between the region corresponding to recess 8 and the region not corresponding to recess 8, and accordingly, a crack tends to occur when barrel polishing is performed on body 10. Thus, in order to avoid such occurrence of a crack, it is conceivable to form recess 8 by digging down at two steps as shown in FIG. 8 instead of one step. In the example shown in FIG. 8, recess 8 has a shape formed by digging down at two steps. In other words, recess 8 includes portions 81 and 82. Portion 81 is formed as a recess at the first step by digging down from first surface 1. Portion 82 is formed as a recess at the second step by further digging down from the bottom of portion 81. Such a configuration makes it possible to prevent the end of recess 8 from having a sharply dug-down shape, with the result that the probability of occurrence of a crack can be reduced. FIG. 8 shows regions 53 and 54. Region 53 is a region in which recess 8 exists. Region 54 is a region in which an R-shape is formed by barrel polishing. In the example shown herein, regions 53 and 54 are in contact with each other without being spaced apart from each other.

Second Embodiment

Figure 9:
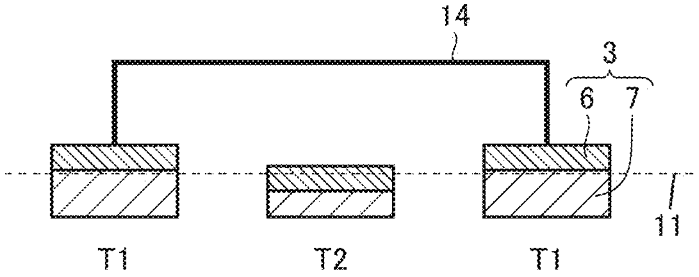
FIG. 9 is a schematic diagram showing a positional relation with respect to a reference plane among a plurality of electrodes included in an electronic component in a second embodiment based on the present disclosure, when viewed from a lateral side.

Referring to FIG. 9, an electronic component in the second embodiment based on the present disclosure will be hereinafter described. FIG. 9 schematically shows a positional relation among the plurality of electrodes 3 in the electronic component in the present embodiment, when viewed from the lateral side.

As shown in FIG. 4 in the first embodiment, in the case where base electrode 6 is disposed at a position more recessed than reference plane 11 in each first-class electrode T1, if the thickness of growing plating film 7 is insufficient, the surface of electrode 3 may be more recessed than reference plane 11. This may lead to a connection failure when the electronic component is mounted. In order to avoid such a situation, it is effective to adopt the configuration shown in FIG. 9. In the example shown in FIG. 9, in each first-class electrode T1, the lower surface of base electrode 6 coincides with reference plane 11, and in second-class electrode T2, the lower surface of base electrode 6 more protrudes than reference plane 11.

Also in the present embodiment, the same effect as that in the first embodiment can be achieved. Further, in the present embodiment, even when plating film 7 has an insufficient thickness, electrode 3 is not recessed more than reference plane 11, and thus, it is possible to reduce the probability that an OPEN failure occurs when the electronic component is mounted.

Figure 10:
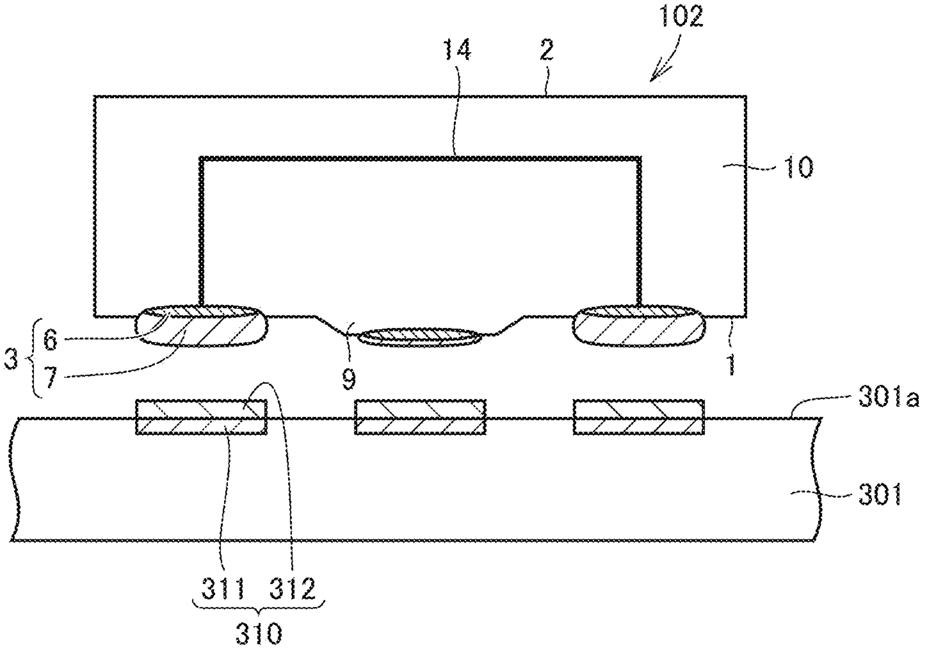
FIG. 10 is an explanatory diagram showing a manner in which the electronic component in the second embodiment based on the present disclosure is to be mounted on a substrate.
Figure 11:
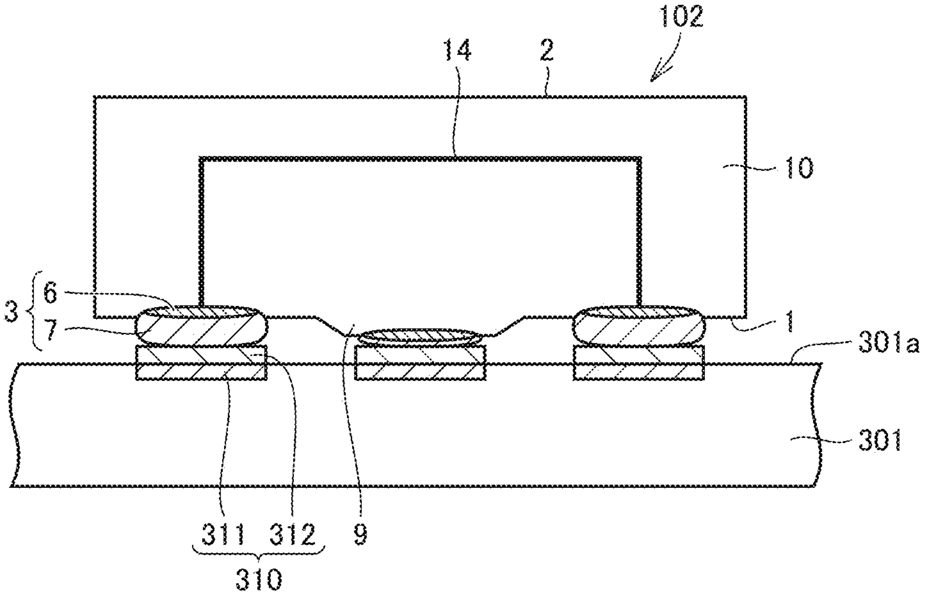
FIG. 11 is an explanatory diagram showing a state in which the electronic component in the second embodiment based on the present disclosure is mounted on the substrate.

FIG. 10 shows a more specific example of the above-described configuration. In an electronic component 102, first surface 1 has a protrusion 9 locally provided to correspond to the second region that is disposed inside protrusion 9. Electronic component 102 in this state is mounted on surface 301*a* of substrate 301, which results in the state as shown in FIG. 11, in which solder is not shown. Electrode 3 is soldered to electrode 310.

Figure 12:
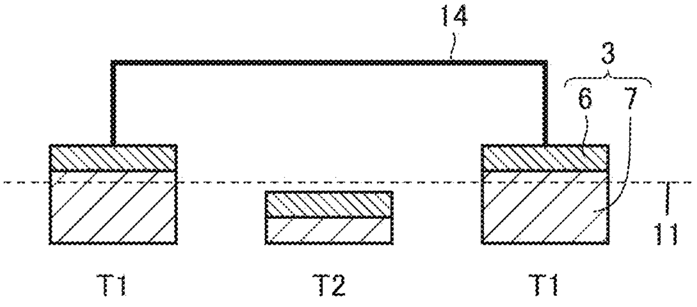
FIG. 12 is a schematic diagram showing a positional relation with respect to a reference plane among a plurality of electrodes included in a modification of the electronic component in the second embodiment based on the present disclosure, when viewed from the lateral side.

When there is a significant difference in growth rate of plating film 7 between first-class electrode T1 and second-class electrode T2, the configuration shown in FIG. 12 may also be conceivable. For first-class electrode T1, the height of the first region is set such that the lower surface of base electrode 6 is more recessed than reference plane 11. For second-class electrode T2, the height of the second region is set such that the lower surface of base electrode 6 more protrudes than reference plane 11.

When the heights of the first and second regions are set, it is preferable to consider also the warpage that body 10 originally has, the difference in number of internal conductor patterns, and the like. For example, in the case where the region corresponding to first-class electrode T1 corresponds to a region that essentially tends to be recessed due to factors such as the warpage of body 10, the difference in number of the internal conductor patterns, and the like, it is also conceivable that even the first region corresponding to first-class electrode T1 is configured to have a recess with a reduced depth or configured to have no recess.

Even though "on first surface 1, the second region in which second-class electrode T2 is disposed more protrudes than the first region in which each first-class electrode T1 is disposed", every region in which second-class electrode T2 is disposed does not necessarily more protrude than every region in which first-class electrode T1 is disposed, but the plurality of electrodes 3 may include some electrodes 3 not following the rule of this relation of magnitude. When attention is focused on at least one first-class electrode T1 and at least one second-class electrode T2 selected as appropriate from among the plurality of electrodes 3, the second region in which the attention-focused second-class electrode T2 is disposed should only protrude more than the first region in which the attention-focused first-class electrode T1 is disposed.

Example in Which Electronic Component is LC Filter

Figure 13:
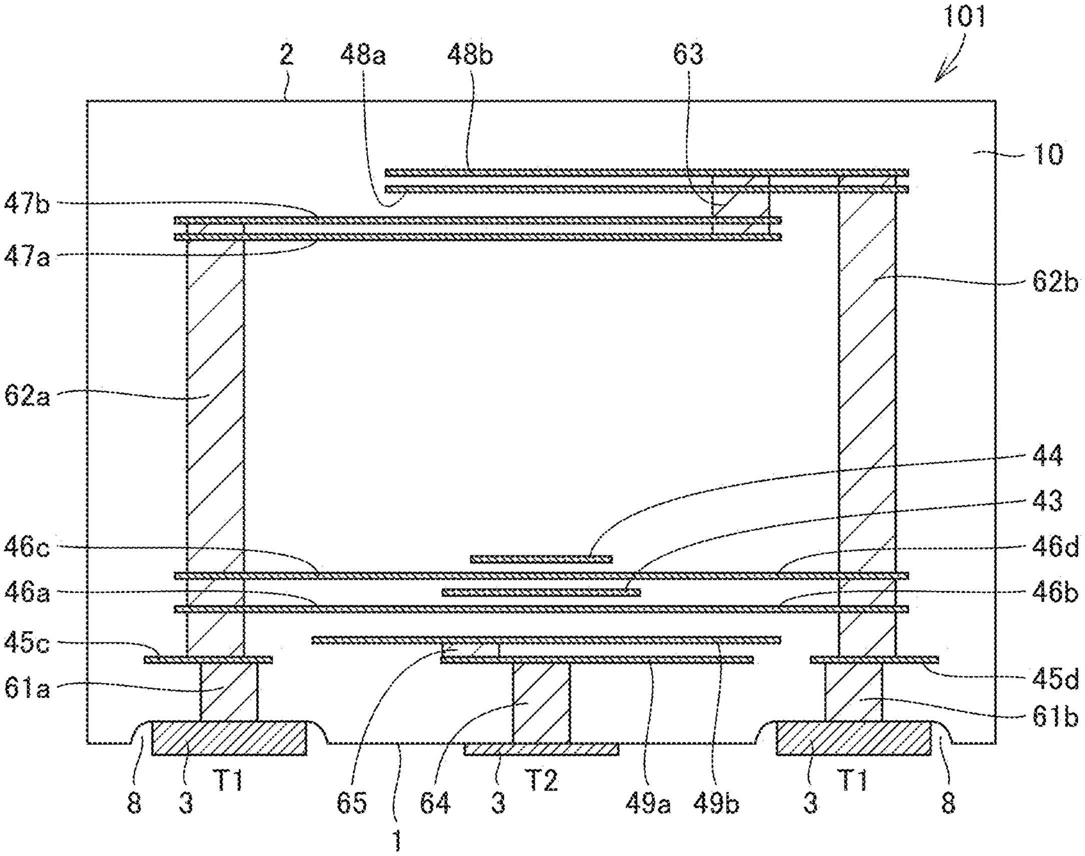
FIG. 13 is a schematic cross-sectional view showing a case where the electronic component in the first embodiment based on the present disclosure is a stack-type LC filter.

As a more specific example, FIG. 13 shows a configuration in which electronic component 101 described in the first embodiment is a stack-type LC filter. Electronic component 101 includes body 10. Body 10 has first surface 1 and second surface 2. Three electrodes 3 are disposed on first surface 1. Three electrodes 3 can be classified into two first-class electrodes T1 and one second-class electrode T2. Two first-class electrodes T1 each are disposed inside recess 8. One second-class electrode T2 is disposed in a region other than recess 8. The thickness of electrode 3 and the depth of recess 8 are shown in an exaggerated manner for convenience of explanation. Internal conductor patterns 43, 44, 45*c*, 45*d*, 46*a*, 46*b*, 46*c*, 46*d*, 47*a*, 47*b*, 48*a*, 48*b*, 49*a*, and 49*b* are disposed inside body 10. Further, conductor vias 61*a*, 61*b*, 62*a*, 62*b*, 63, 64, and 65 are disposed inside body 10. In FIG. 13, internal conductor patterns 46*a* and 46*b* are shown as being connected to each other, but are actually separated from each other at some midpoint. The tip ends of internal conductor patterns 46*a* and 46*b* are located in a positional relation such that they overlap with each other in the direction perpendicular to the surface of the sheet of paper showing FIG. 13. The same applies to internal conductor patterns 46*c* and 46*d*. Electrode 3 on the left side in FIG. 13 is electrically connected to electrode 3 on the right side through conductor via 61*a*, internal conductor pattern 45*c*, conductor via 62*a*, internal conductor patterns 47*a* and 47*b*, conductor via 63, internal conductor patterns 48*a* and 48*b*, conductor via 62*b*, internal conductor pattern 45*d*, conductor via 61*b*, and the like. Thus, each of electrodes 3 on the left and right sides corresponds to first-class electrode T1. On the other hand, center electrode 3 is connected to internal conductor pattern 49*b* through conductor via 64, internal conductor pattern 49*a*, and conductor via 65, but is not connected to other electrodes 3. Therefore, center electrode 3 corresponds to second-class electrode T2.

Third Embodiment

Figure 14:
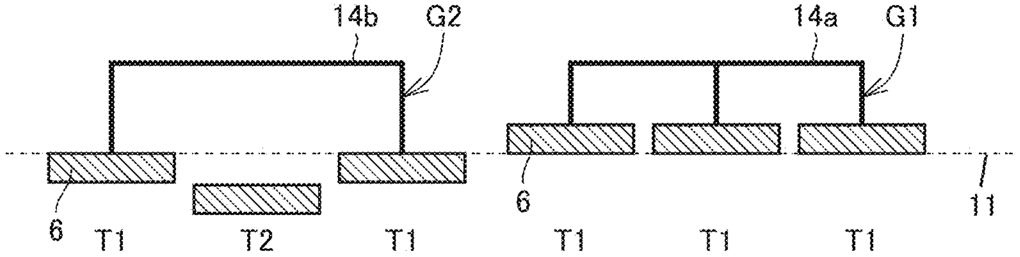
FIG. 14 is a schematic diagram showing a positional relation with respect to a reference plane among a plurality of electrodes included in an electronic component in a third embodiment based on the present disclosure, when viewed from a lateral side.

Referring to FIG. 14, an electronic component in the third embodiment based on the present disclosure will be hereinafter described. The electronic component in the present embodiment includes six electrodes, by way of example. FIG. 14 shows the state before the six electrodes are subjected to a plating treatment. FIG. 14 shows a difference in height of base electrodes 6. Among these six electrodes, three electrodes are connected by a wiring line 14*a* and two electrodes are connected by a wiring line 14*b*. The remaining one electrode is not connected to other electrodes. Thus, among the six electrodes, five electrodes each correspond to first-class electrode T1, and the remaining one electrode corresponds to second-class electrode T2.

In the electronic component in the present embodiment, first-class electrodes T1 connected to each other by the wiring line are referred to as a group and the number of the first-class electrodes belonging to one group is referred to as the number of connections. In this case, there are a first group G1 in which the number of connections is N1 and a second group G2 in which the number of connections is N2 smaller than N1, and a region in which first group G1 is disposed is more recessed than a region in which second group G2 is disposed. In the example shown in FIG. 14, the number of connections N1 of first group G1 is 3, and the number of connections N2 of second group G2 is 2. In other words, N1>N2. As compared with base electrode 6 of second-class electrode T2, base electrode 6 of first-class electrode T1 belonging to second group G2 is relatively recessed, and base electrode 6 of first-class electrode T1 belonging to first group G1 is further relatively recessed. In the example shown herein, the lower surface of base electrode 6 of first-class electrode T1 belonging to first group G1 coincides with reference plane 11.

When base electrode 6 is subjected to a plating treatment, plating film 7 tends to grow faster in the group including a larger number of connections. In the present embodiment, however, the region provided with base electrode 6 of first-class electrode T1 belonging to first group G1 including a larger number of connections is relatively recessed as compared with the region provided with base electrode 6 of first-class electrode T1 belonging to second group G2 including a smaller number of connections. Thus, the height of the surface of each electrode 3 obtained after plating film 7 has grown can be made substantially the same.

More Specific Example

Figure 15:
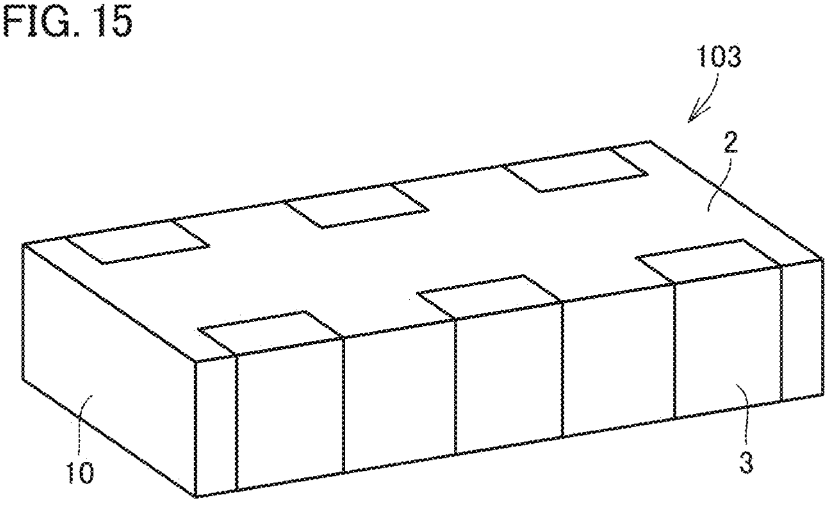
FIG. 15 is a perspective view of a specific example of the electronic component in the third embodiment based on the present disclosure.

Referring to FIGS. 15 to 18, a more specific example of the present embodiment will be hereinafter described. As shown in FIG. 15, an electronic component 103 includes body 10 having a substantially rectangular parallelepiped shape, and body 10 has first surface 1 and second surface 2.

Figure 16:
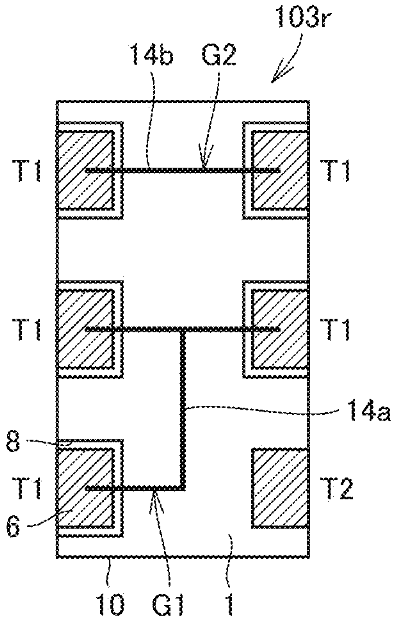
FIG. 16 is an explanatory diagram showing a state before the electronic component in the third embodiment based on the present disclosure is subjected to a plating treatment, when viewed from a side of a first surface.
Figure 17:
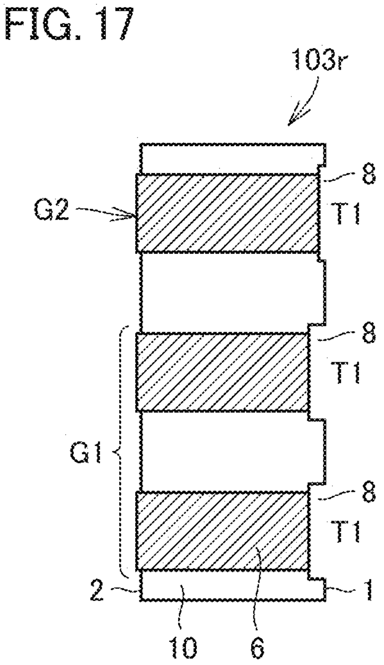
FIG. 17 is a left side view of FIG. 16 showing a state before the electronic component in the third embodiment based on the present disclosure is subjected to a plating treatment.
Figure 18:
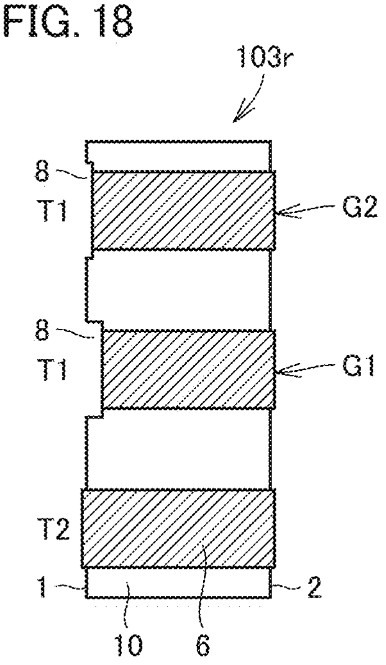
FIG. 18 is a right side view of FIG. 16 showing a state before the electronic component in the third embodiment based on the present disclosure is subjected to a plating treatment.

Three electrodes 3 are arranged on each of two side surfaces on the long side. Electrode 3 includes: a portion vertically extending across the side surface; a portion extending to cover a part of first surface 1; and a portion extending to cover a part of second surface 2. Electronic component 103 in the state before it is subjected to a plating treatment is referred to as a structure body 103*r*. FIG. 16 shows structure body 103*r* when viewed from directly below, i.e., viewed from the first surface 1 side. FIG. 17 also shows structure body 103*r* when viewed from the left side in FIG. 16. FIG. 18 also shows structure body 103*r* when viewed from the right side in FIG. 16. In FIG. 16, portions of six base electrodes 6 that extend along first surface 1 are seen. FIG. 16 schematically shows an electrical connection between base electrodes 6 inside body 10 by thick lines. Three base electrodes 6 are connected by wiring line 14*a*. Three electrodes 3 formed by three base electrodes 6 connected by wiring line 14*a* are defined as first group G1. Two base electrodes 6 are connected by wiring line 14*b*. Two electrodes 3 formed by two base electrodes 6 connected by wiring line 14*b* are defined as second group G2. Each of electrodes 3 to be formed from a total of five base electrodes 6 in first group G1 and second group G2 corresponds to first-class electrode T1. The remaining one base electrode 6 is not electrically connected to other base electrodes 6, and electrode 3 to be formed from this remaining one base electrode 6 corresponds to second-class electrode T2. FIGS. 16 to 18 each show structure body 103*r* in the state before it is subjected to a plating treatment, and thus, each electrode 3 is still not completed as electrode 3 but denoted by T1 and T2 for convenience of explanation. On first surface 1, base electrode 6 to be formed as electrode 3 belonging to first-class electrode T1 is disposed inside recess 8, and base electrode 6 to be formed as electrode 3 belonging to second-class electrode T2 is disposed in a portion where no recess 8 is provided. Also among base electrodes 6 each to be formed as electrode 3 belonging to first-class electrode T1, the depth of recess 8 is different between first group G1 and second group G2. The region provided with each base electrode 6 belonging to the group including a larger number of connections is located inside deeper recess 8.

In electronic component 103, whether recess 8 exists or not is different between base electrode 6 to be formed as first-class electrode T1 and base electrode 6 to be formed as second-class electrode T2, and also, the depth of recess 8 is different among first-class electrodes T1 depending on whether the number of connections in the group is larger or smaller. Thus, after base electrode 6 is subjected to a plating treatment, the thickness of plating film 7 becomes uneven. Therefore, by appropriately setting the depth of each recess 8, the height of the lower surface of each electrode 3 can be made substantially the same at the time when electronic component 103 is completed.

Fourth Embodiment

Figure 19:
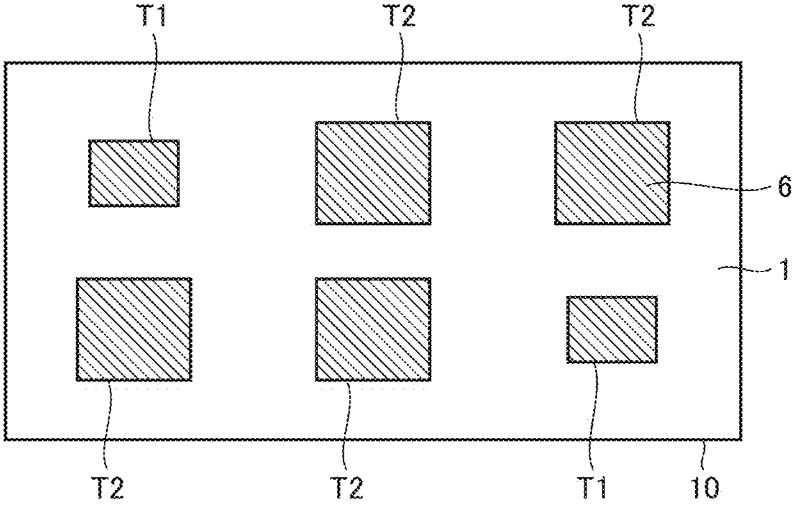
FIG. 19 is a plan view showing a state before an electronic component in a fourth embodiment based on the present disclosure is subjected to a plating treatment, when viewed from a side of a first surface.
Figure 20:
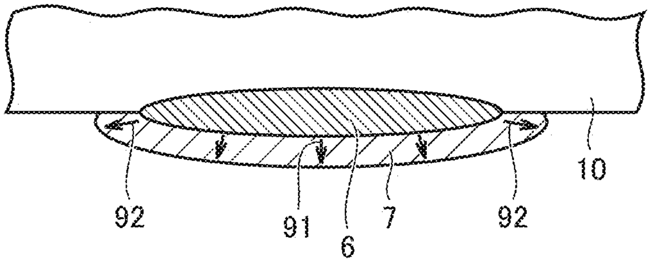
FIG. 20 is an explanatory diagram showing a manner in which a plating film grows on a surface of a base electrode when manufacturing the electronic component in the fourth embodiment based on the present disclosure.
Figure 21:
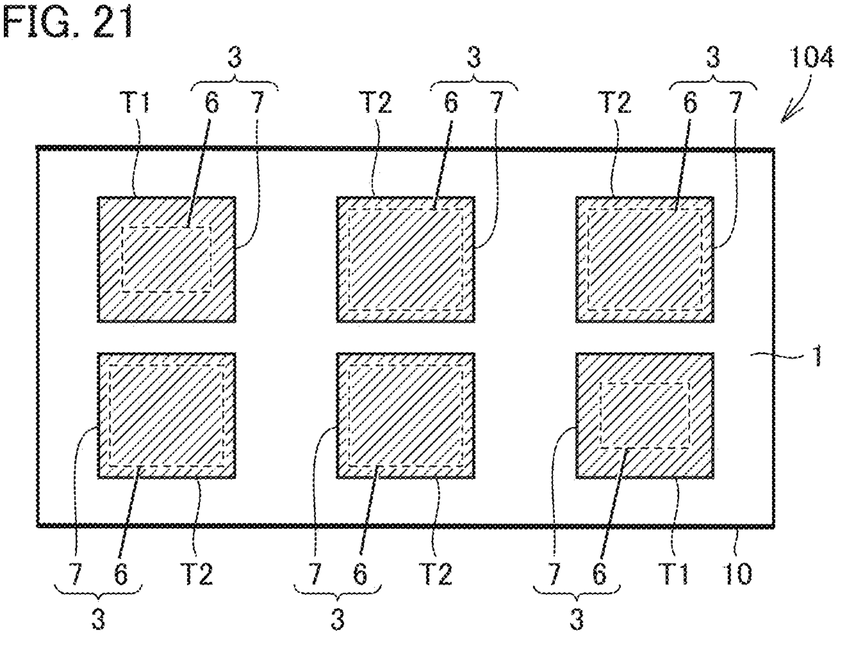
FIG. 21 is a plan view showing a state after the electronic component in the fourth embodiment based on the present disclosure is subjected to a plating treatment, when viewed from the side of the first surface.

Referring to FIGS. 19 to 21, an electronic component in the fourth embodiment based on the present disclosure will be hereinafter described. FIG. 19 shows the state before an electronic component in the present embodiment is subjected to a plating treatment, when viewed from the first surface 1 side. Six base electrodes 6 are disposed on first surface 1. Base electrode 6 to be formed as first-class electrode T1 is smaller than base electrode 6 to be formed as second-class electrode T2. FIG. 20 shows the manner in which plating film 7 grows on the surface of base electrode 6. FIG. 21 shows the state after electronic component 104 in the present embodiment is subjected to a plating treatment, when viewed from the first surface 1 side.

In an electronic component 104 in the present embodiment, when viewed from the direction perpendicular to first surface 1, the area occupied by base electrode 6 included in second-class electrode T2 is larger than the area occupied by base electrode 6 included in first-class electrode T1, as shown in FIG. 19.

When base electrode 6 disposed on the surface of body 10 is subjected to a plating treatment, the growth of plating film 7 proceeds as shown in FIG. 20. In other words, plating film 7 grows in the thickness direction as indicated by arrows 91 and also simultaneously grows from the outer periphery of base electrode 6 toward the lateral side as indicated by arrows 92. Thus, in the case where some base electrodes 6 are relatively small in size in a plan view and relatively fast in plating growth rate, and some base electrodes 6 are relatively large in size in a plan view and relatively slow in plating growth rate, the sizes of these base electrodes 6 in a plan view can be made substantially the same at the time when the plating treatment is completed. As shown in FIG. 21, base electrodes 6 as underlying electrodes are different in size among six electrodes 3. However, at the stage when plating film 7 is formed, electrodes 3 in a plan view are not substantially different in size between first-class electrode T1 and second-class electrode T2, and have the same size. In this way, the sizes of electrodes 3 in a plan view can be made the same.

Fifth Embodiment

Figure 22:
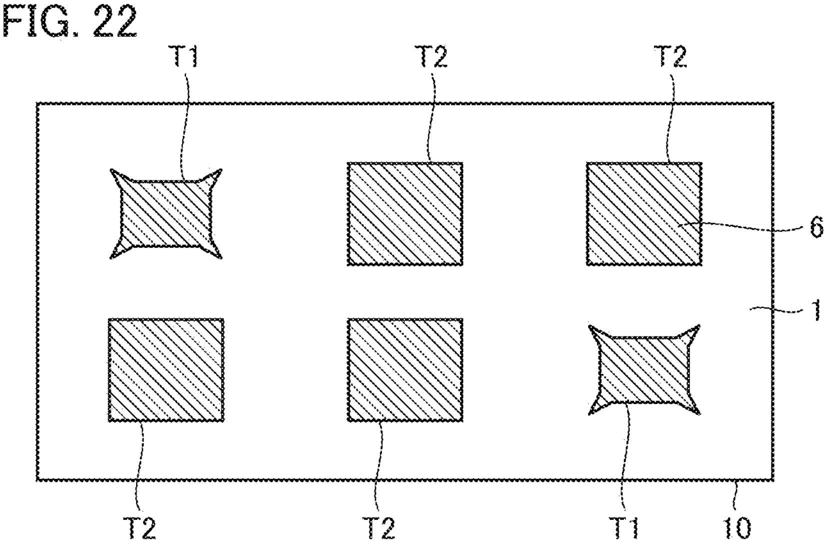
FIG. 22 is a plan view of a state before an electronic component in a fifth embodiment based on the present disclosure is subjected to a plating treatment, when viewed from a side of a first surface.
Figure 23:
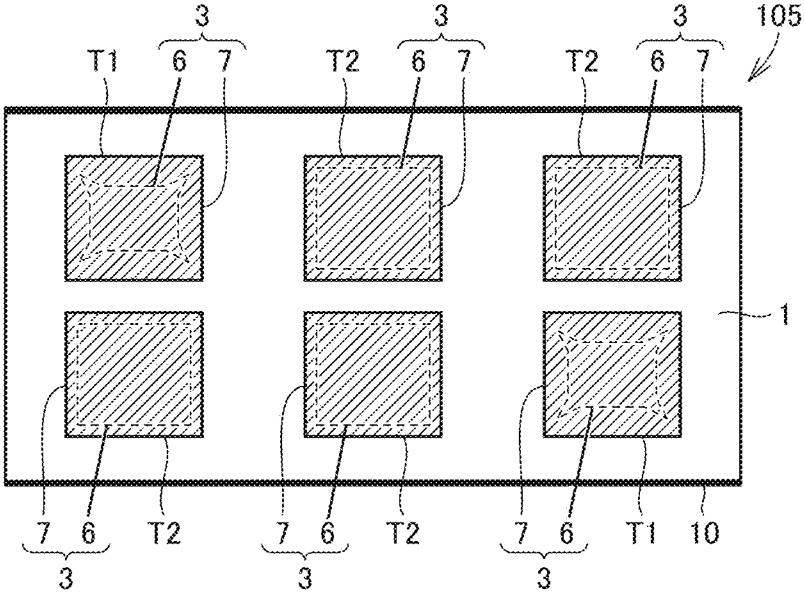
FIG. 23 is a plan view showing a state after the electronic component in the fifth embodiment based on the present disclosure is subjected to a plating treatment, when viewed from the side of the first surface.

Referring to FIGS. 22 to 23, an electronic component in the fifth embodiment based on the present disclosure will be hereinafter described. FIG. 22 shows the state before the electronic component in the present embodiment is subjected to a plating treatment, when viewed from the first surface 1 side. Six base electrodes 6 are disposed on first surface 1. Two base electrodes 6 each to be formed as first-class electrode T1 have corner portions each having a pointed shape. FIG. 23 shows the state after an electronic component 105 in the present embodiment is subjected to a plating treatment, when viewed from the first surface 1 side.

In electronic component 105 in the present embodiment, when viewed from the direction perpendicular to first surface 1, base electrode 6 included in first-class electrode T1 has corner portions each having a pointed shape.

When base electrode 6 is subjected to a plating treatment, plating film 7 grows in the thickness direction and also grows laterally from the outer periphery of base electrode 6, as shown in FIG. 20. When the corner portion of base electrode 6 has a right angle in a plan view, the corner portion tends to be rounded as a result of the growth of the plating film in the lateral direction. However, if the corner portion of base electrode 6 included in first-class electrode T1 has a pointed shape as illustrated in the present embodiment, as a plating film grows, the pointed corner portion becomes wrapped by plating film 7 and then formed into an un-pointed shape. As a result, electrode 3 obtained after the growth of the plating film has a shape having substantially right-angled corner portions. As shown in FIG. 22, there is a difference among six electrodes 3 in shape of each corner portion of base electrode 6 serving as an underlying electrode. At the stage when formation of plating film 7 is ended, however, electrodes 3 are substantially not different in shape in a plan view between first-class electrode T1 and second-class electrode T2 and have similar shapes. In this way, the shapes of electrodes 3 in a plan view can be made the same.

When it is strictly required to prevent each corner portion of electrode 3 as first-class electrode T1 from becoming rounded in shape, it is effective that each corner portion of the base electrode included in first-class electrode T1 is formed to have a pointed shape as described in the present embodiment.

Manufacturing Method

Referring to FIGS. 24 to 28, the following describes a method of forming a configuration in which electrode 3 is disposed inside recess 8. The configuration in which electrode 3 is disposed inside recess 8 is, for example, as shown in FIG. 5.

Figure 24:
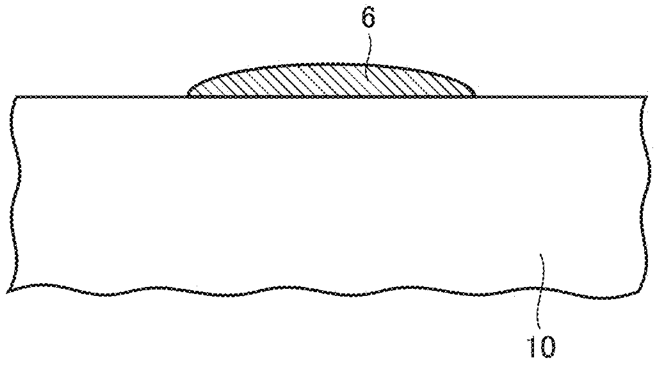
FIG. 24 is a first explanatory diagram of a method of forming a configuration in which an electrode is disposed inside a recess.
Figure 25:
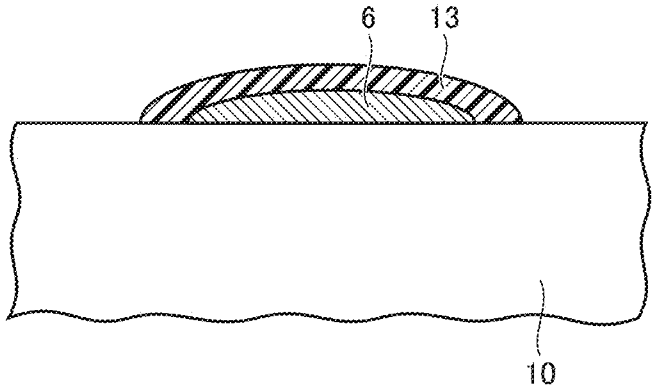
FIG. 25 is a second explanatory diagram of the method of forming the configuration in which the electrode is disposed inside the recess.
Figure 26:
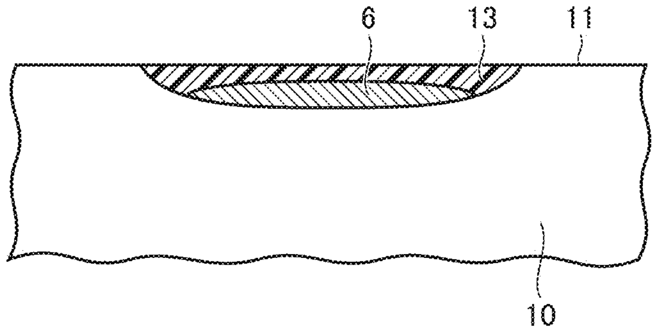
FIG. 26 is a third explanatory diagram of the method of forming the configuration in which the electrode is disposed inside the recess.
Figure 27:
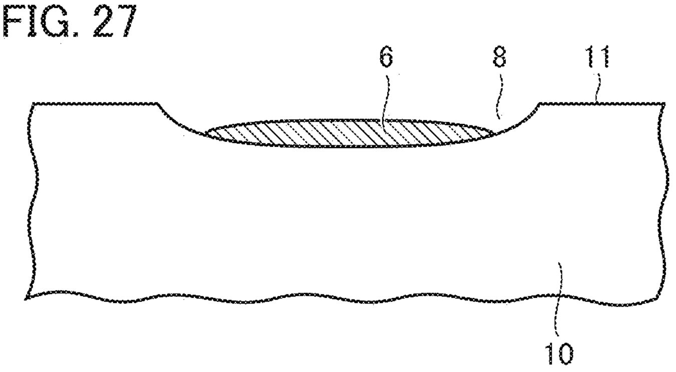
FIG. 27 is a fourth explanatory diagram of the method of forming the configuration in which the electrode is disposed inside the recess.
Figure 28:
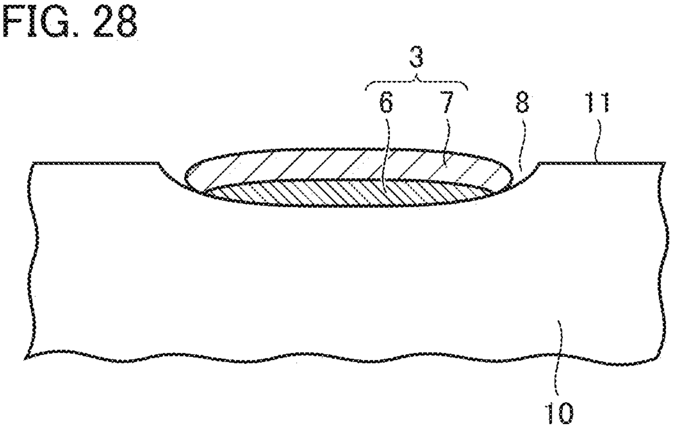
FIG. 28 is a fifth explanatory diagram of the method of forming the configuration in which the electrode is disposed inside the recess.

First, as shown in FIG. 24, base electrode 6 is formed by printing a conductive paste on a flat surface of body 10. The conductive paste used herein may be a Cu paste, for example. Then, as shown in FIG. 25, a resin paste is printed so as to cover base electrode 6. Thus, a resin paste layer 13 is formed. Then, press working is performed as shown in FIG. 26. In this way, base electrode 6 and resin paste layer 13 are pressed into the surface of body 10, and the surface of resin paste layer 13 is located to be almost flush with the reference plane of body 10. By performing firing in this state, resin paste layer 13 is burned, thus resulting in the state as shown in FIG. 27, which is specifically the state in which recess 8 is formed and base electrode 6 is disposed inside recess 8. Then, a plating treatment is performed. Thus, as shown in FIG. 28, plating film 7 grows based on base electrode 6. When plating film 7 grows sufficiently in the thickness direction, plating film 7 protrudes from recess 8 in the thickness direction.

Figure 29:
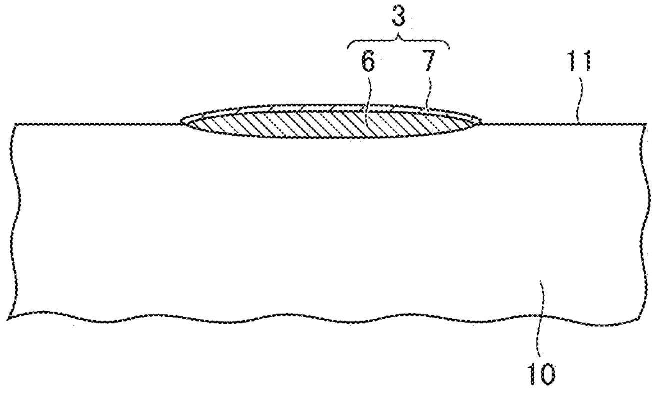
FIG. 29 is an explanatory diagram of a method of forming a configuration in which an electrode is disposed in a region having no recess.

On the other hand, in the region in which recess 8 is not to be provided, a plating treatment should only be performed starting from the state in which base electrode 6 is pressed into the surface of body 10 by press working. In this way, plating film 7 grows on the exposed surface of base electrode 6, with the result that electrode 3 having the structure shown in FIG. 29 can be obtained. In the example shown in FIG. 29, the plating treatment is performed starting from the state in which base electrode 6 is pressed by half into the surface of body 10.

Among the above-described embodiments, a plurality of embodiments may be employed in an appropriate combination.

Note that the above embodiments disclosed herein are illustrative and non-restrictive in every respect. The scope of the present disclosure is defined by the scope of the claims, and is intended to include any modifications within the meaning and scope equivalent to the scope of the claims.

1 first surface, 2 second surface, 3 electrode, 6 base electrode, 7 plating film, 8 recess, 9 protrusion, 10 body, 11 reference plane, 13 resin paste layer, 14, 14*a*, 14*b* wiring line, 43, 44, 45*c*, 45*d*, 46*a*, 46*b*, 46*c*, 46*d*, 47*a*, 47*b*, 48*a*, 48*b*, 49*a*, 49*b* internal conductor pattern, 51, 52, 53, 54 region, 61*a*, 61*b*, 62*a*, 62*b*, 63, 64, 65 conductor via, 81, 82 portion, 101, 102, 103, 104, 105 electronic component, 103*r* structure body, 301 substrate, 301*a* surface, 310 electrode, 311 base electrode, 312 plating film.

The invention claimed is:

1. An electronic component comprising:

a body having a first surface that is entirely of a dielectric material; and a plurality of electrodes disposed on the first surface, wherein each of the plurality of electrodes includes a base electrode and a plating film covering the base electrode, wherein the plurality of electrodes includes first-class electrodes individually disposed on the first surface and connected to each other by a wiring line passing through an inside of the body, and a second-class electrode individually disposed on the first surface and not connected to other electrodes of the plurality of electrodes, wherein the first surface includes a first region on which each of the first-class electrodes are disposed, and a second region on which the second-class electrode is disposed, and the second region is more protruded than the first region, and wherein the first surface has a protrusion locally provided to correspond to the second region, and the second region is located inside the protrusion.

2. The electronic component according to claim 1, wherein, when viewed from a direction perpendicular to the first surface, the base electrode included in each of the first-class electrodes includes a corner portion having a pointed shape.

3. The electronic component according to claim 1, wherein the first surface has a recess locally provided to correspond to the first region, and the first region is located inside the recess.

4. The electronic component according to claim 1, wherein, when the first-class electrodes connected to each other by the wiring line are defined as a group, and a number of the first-class electrodes belonging to one group is defined as a number of connections, there are a first group in which the number of connections is N1 and a second group in which the number of connections is N2 smaller than N1, and a region in which the first group is disposed is more recessed than a region in which the second group is disposed.

5. The electronic component according to claim 1, wherein, when viewed from a direction perpendicular to the first surface, an area occupied by the base electrode included in the second-class electrode is larger than an area occupied by the base electrode included in each of the first-class electrodes.

6. The electronic component according to claim 1, wherein, when viewed from a direction perpendicular to the first surface, the base electrode included in each of the first-class electrodes includes a corner portion having a pointed shape.

7. An electronic component comprising:

a body having a first surface that is entirely of a dielectric material; and a plurality of electrodes disposed on the first surface, wherein each of the plurality of electrodes includes a base electrode and a plating film covering the base electrode, wherein the plurality of electrodes includes first-class electrodes individually disposed on the first surface and connected to each other by a wiring line passing through an inside of the body, and a second-class electrode individually disposed on the first surface and not connected to other electrodes of the plurality of electrodes, wherein the first surface includes a first region on which each of the first-class electrodes are disposed, and a second region on which the second-class electrode is disposed, and the second region is more protruded than the first region, and wherein the first surface has a recess locally provided to correspond to the first region, and the first region is located inside the recess.

8. The electronic component according to claim 7, wherein the recess is provided to extend to an end of the first surface.

9. The electronic component according to claim 7, wherein, when viewed from a direction perpendicular to the first surface, an area occupied by the base electrode included in the second-class electrode is larger than an area occupied by the base electrode included in each of the first-class electrodes.

10. The electronic component according to claim 7, wherein, when the first-class electrodes connected to each other by the wiring line are defined as a group, and a number of the first-class electrodes belonging to one group is defined as a number of connections, there are a first group in which the number of connections is N1 and a second group in which the number of connections is N2 smaller than N1, and a region in which the first group is disposed is more recessed than a region in which the second group is disposed.

11. The electronic component according to claim 7, wherein, when viewed from a direction perpendicular to the first surface, the base electrode included in each of the first-class electrodes includes a corner portion having a pointed shape.

12. The electronic component according to claim 7, wherein, when the first-class electrodes connected to each other by the wiring line are defined as a group, and a number of the first-class electrodes belonging to one group is defined as a number of connections, there are a first group in which the number of connections is N1 and a second group in which the number of connections is N2 smaller than N1, and a region in which the first group is disposed is more recessed than a region in which the second group is disposed.

13. The electronic component according to claim 12, wherein, when viewed from a direction perpendicular to the first surface, an area occupied by the base electrode included in the second-class electrode is larger than an area occupied by the base electrode included in each of the first-class electrodes.

14. The electronic component according to claim 12, wherein, when viewed from a direction perpendicular to the first surface, the base electrode included in each of the first-class electrodes includes a corner portion having a pointed shape.

15. An electronic component comprising:

a body having a first surface that is entirely of a dielectric material; and a plurality of electrodes disposed on the first surface, wherein each of the plurality of electrodes includes a base electrode and a plating film covering the base electrode, wherein the plurality of electrodes includes first-class electrodes individually disposed on the first surface and connected to each other by a wiring line passing through an inside of the body, and a second-class electrode individually disposed on the first surface and not connected to other electrodes of the plurality of electrodes, wherein the first surface includes a first region on which each of the first-class electrodes are disposed, and a second region on which the second-class electrode is disposed, and the second region is more protruded than the first region, and wherein, when viewed from a direction perpendicular to the first surface, an area occupied by the base electrode included in the second-class electrode is larger than an area occupied by the base electrode included in each of the first-class electrodes.

16. The electronic component according to claim 15, wherein, when viewed from a direction perpendicular to the first surface, the base electrode included in each of the first-class electrodes includes a corner portion having a pointed shape.

* * * * *